United States Patent
Takeuchi et al.

(10) Patent No.: US 6,637,102 B2
(45) Date of Patent: *Oct. 28, 2003

(54) PROCESS FOR PRODUCING AN INDUSTRIAL MEMBER HAVING THROUGHHOLES OF HIGH ASPECT RATIO

(75) Inventors: Yukihisa Takeuchi, Nishikamo-Gun (JP); Hiroyuki Tsuji, Nagoya (JP); Kazumasa Kitamura, Itinomiya (JP); Yoshinori Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/883,133

(22) Filed: Jun. 15, 2001

(65) Prior Publication Data

US 2002/0038507 A1 Apr. 4, 2002

Related U.S. Application Data

(63) Continuation-in-part of application No. 09/771,223, filed on Jan. 26, 2001.

(30) Foreign Application Priority Data

| Jul. 19, 2000 | (JP) | 2000-218378 |
| Sep. 14, 2000 | (JP) | 2000-280573 |
| Mar. 16, 2001 | (JP) | 2001-076832 |
| Apr. 27, 2001 | (JP) | 2001-131490 |

(51) Int. Cl.$^7$ ............................................. H05K 3/36
(52) U.S. Cl. ........................ 29/830; 29/846; 29/852; 29/861
(58) Field of Search .................. 29/830, 852, 743, 29/759, 464, 465, 467, 469; 72/355.4; 83/100, 142, 168, 177, 425.3, 468.2

(56) References Cited

U.S. PATENT DOCUMENTS 2,504,642 A * 4/1950 Burgess
3,803,697 A    4/1974 Baker et al.
4,192,063 A    3/1980 Sato (List continued on next page.)

FOREIGN PATENT DOCUMENTS

| EP | 1078721 | * 2/2001 |
| JP | 59-198853 | 11/1984 |
| JP | 3-46393 | 2/1991 |
| JP | 9-19914 | 1/1997 |
| JP | 09-019914 | * 1/1997 |

OTHER PUBLICATIONS

U.S. patent application Ser. No. 10/128,152, Takeuchi et al., filed Apr. 23, 2002.
U.S. patent application Ser. No. 10/293,241, Takeuchi et al., filed Nov. 13, 2002.

(List continued on next page.)

*Primary Examiner*—Gregory Vidovich
*Assistant Examiner*—Eric Compton
(74) *Attorney, Agent, or Firm*—Burr & Brown

(57) ABSTRACT

A fabrication method of an industrial part having high-aspect-ratio through-hole sections using a punch and a die, includes: a first step of drilling a first hole section in a first sheet of sheet material with the punch; a second step of lifting the first sheet in tight contact with a stripper under a condition that the punch is not pulled out from the first hole section; a third step of lifting the punch so that a tip section of said punch is slightly drawn in from a bottom section of the lifted first sheet of sheet material; a fourth step of drilling a second hole section in a second sheet of sheet material with the punch; a fifth step of lifting the second sheet in tight contact with the first sheet under a condition that the punch is not pulled out from the second hole section; and a sixth step of lifting the punch so that a tip section of the punch is slightly drawn in from the bottom section of the lifted second sheet of sheet material. Subsequently, the fourth to sixth steps are repeated for lamination of a plurality of sheets of sheet material.

13 Claims, 14 Drawing Sheets

U.S. PATENT DOCUMENTS

| | | | |
|---|---|---|---|
| 4,432,037 A | | 2/1984 | Brabetz |
| 4,564,986 A | | 1/1986 | Peterson |
| 4,650,951 A | | 3/1987 | Koga et al. |
| 4,791,721 A | * | 12/1988 | Anderson et al. |
| 4,916,260 A | * | 4/1990 | Broaddues et al. |
| 5,289,629 A | * | 3/1994 | Stade et al. |
| 5,305,523 A | | 4/1994 | Bross et al. |
| 5,316,602 A | * | 5/1994 | Kogame et al. |
| 5,456,004 A | | 10/1995 | Swamy |
| 5,678,970 A | | 10/1997 | Caulk |
| 5,857,397 A | * | 1/1999 | Matsubayashi et al. |
| 5,925,206 A | | 7/1999 | Bokyo et al. |
| 5,970,606 A | * | 10/1999 | Buechele |
| 6,066,226 A | | 5/2000 | Nagata et al. |
| 2002/0020057 A1 | * | 2/2002 | Takeuchi et al. |
| 2002/0038507 A1 | | 4/2002 | Takeuchi et al. |

OTHER PUBLICATIONS

U.S. patent application Ser. No. 10/128,152, Takeuchi et al., filed Apr. 23, 2002.

U.S. patent application Ser. No. 10/160,998, Takeuchi et al., filed Jun. 3, 2002.

* cited by examiner

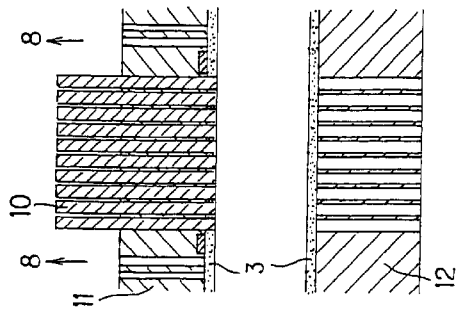
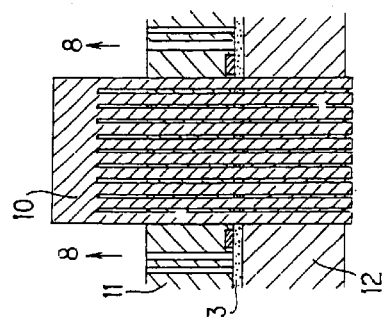
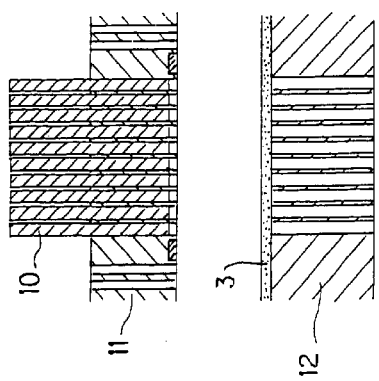
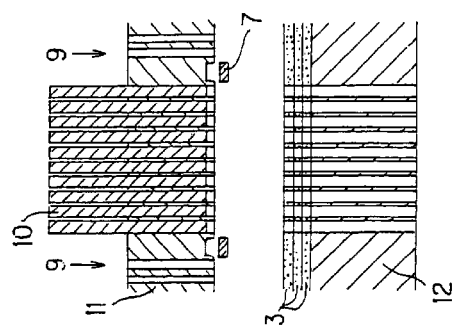
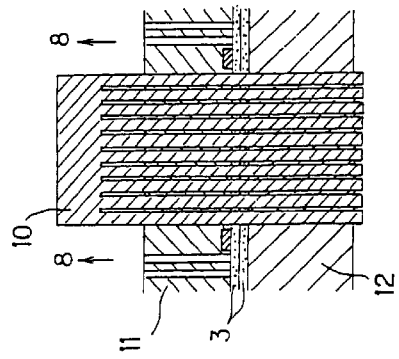

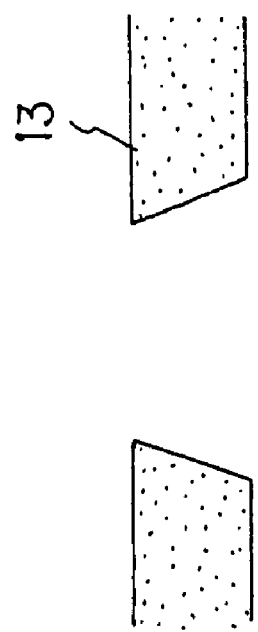
Fig. 3(b) - Prior Art
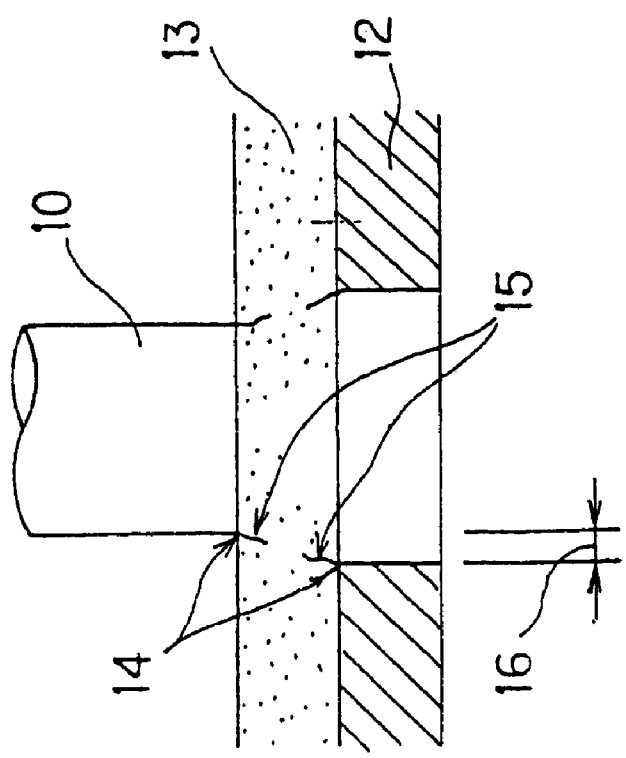
Fig. 3(a) - Prior Art

Fig. 6
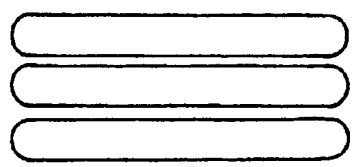
Fig. 7 - Prior Art
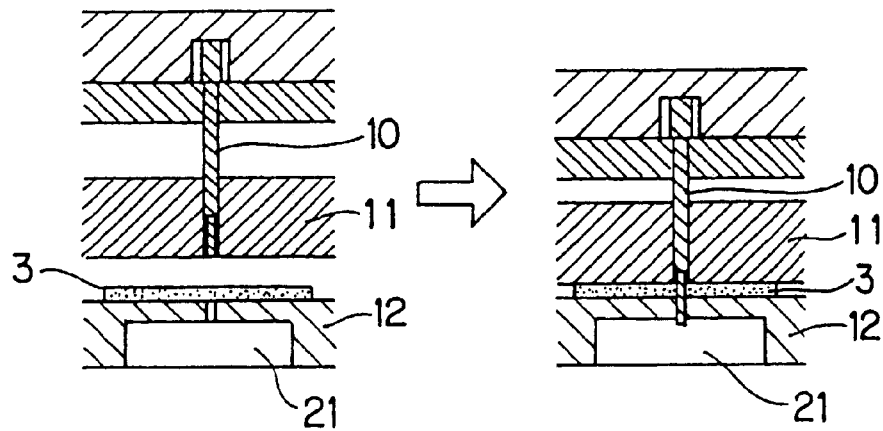
Fig. 8 - Prior Art
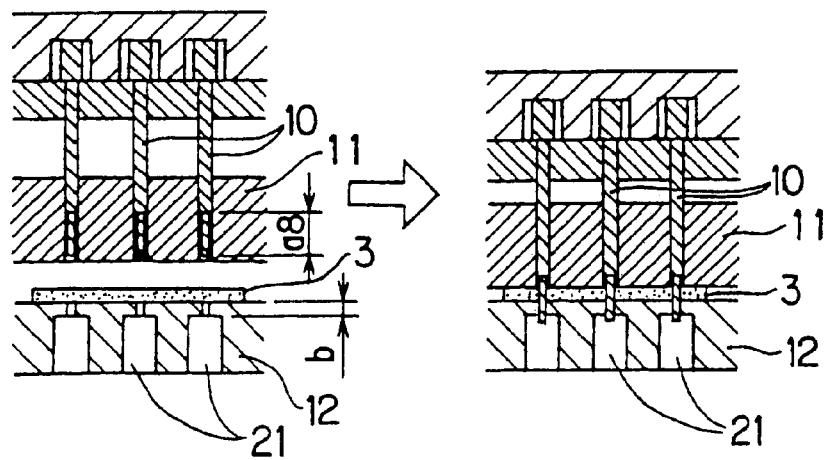

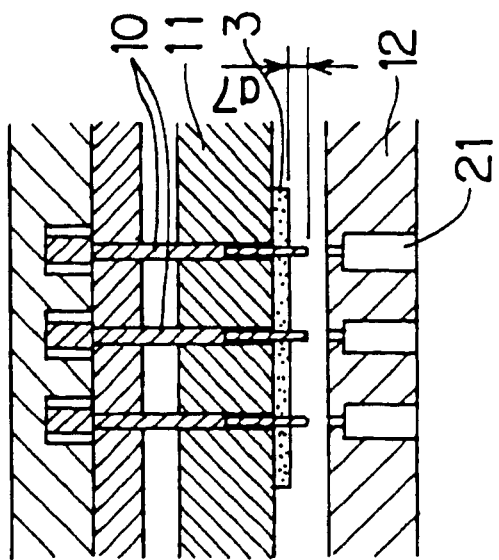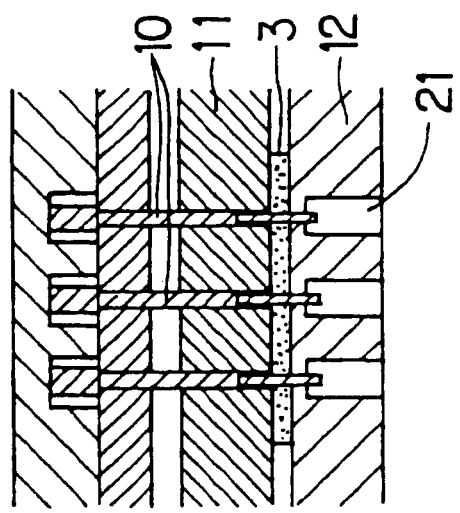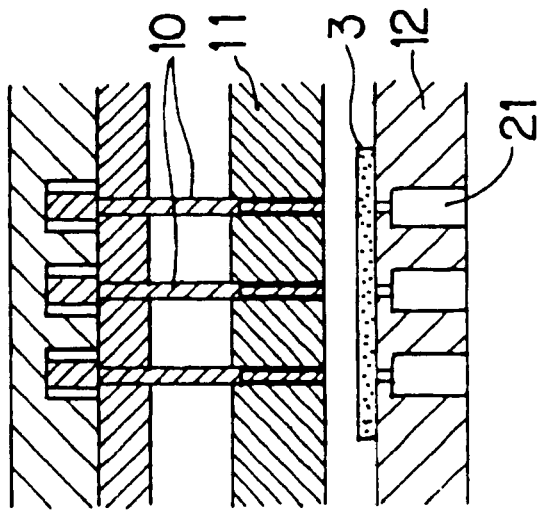

Fig. 10 - Prior Art
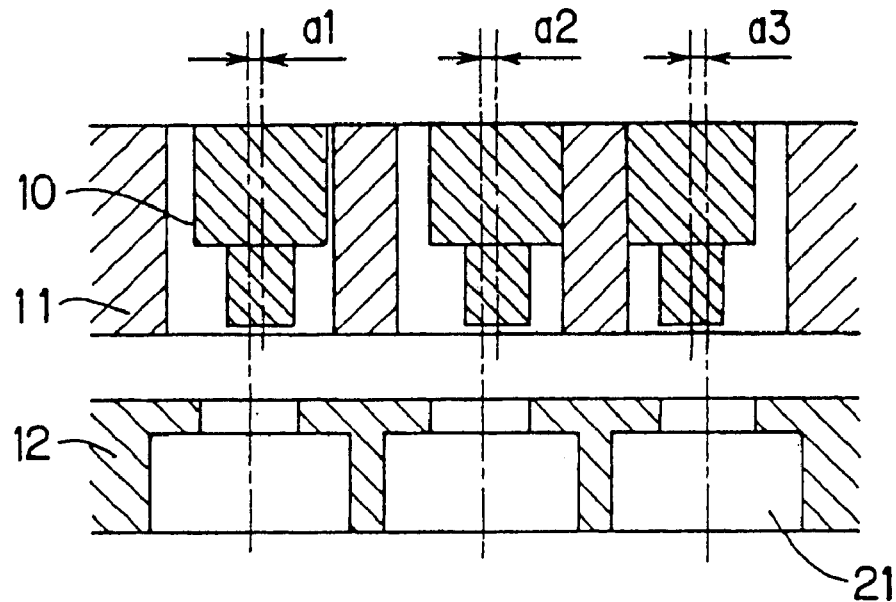
Fig. 11
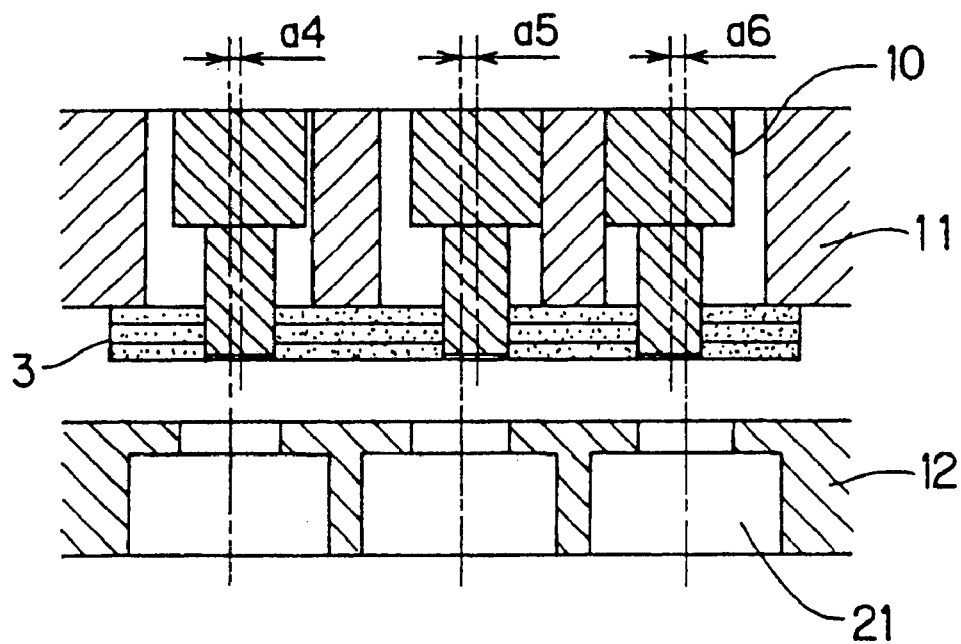

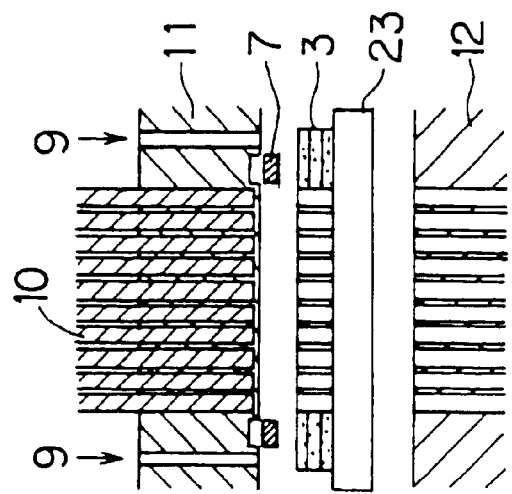
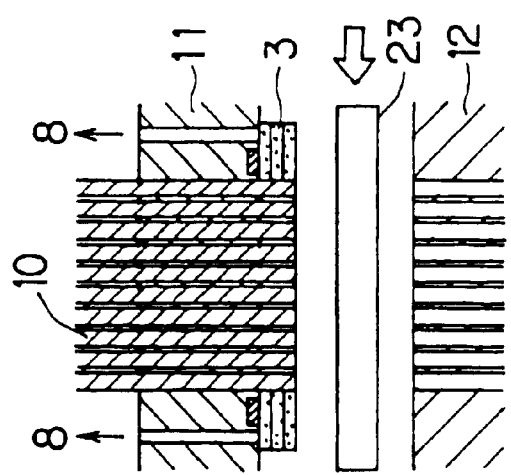
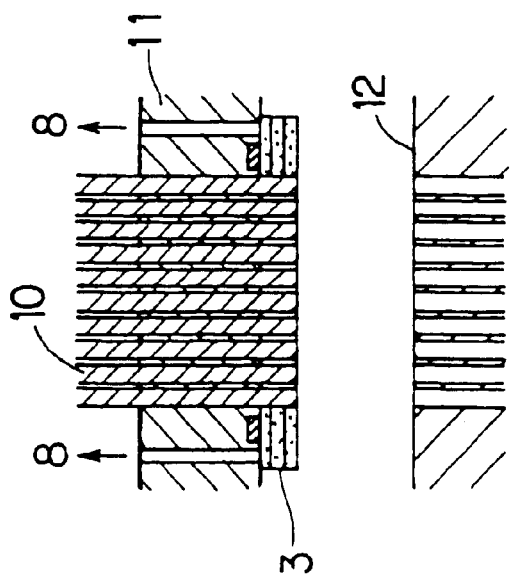

FIG.13(a)   FIG.13(b)   FIG.13(c)
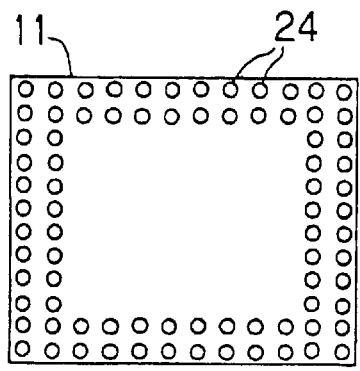 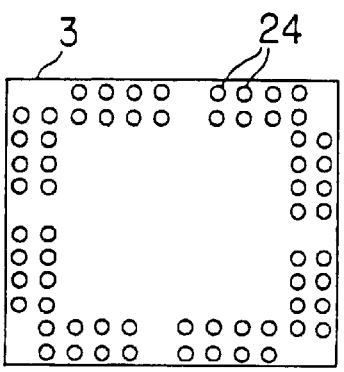 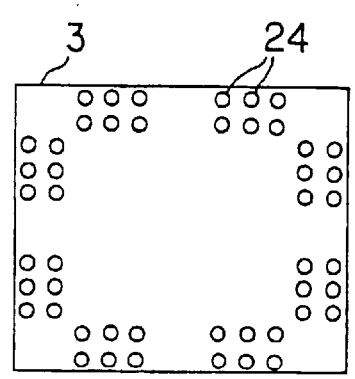
FIG.13(d)   FIG.13(e)   FIG.13(f)
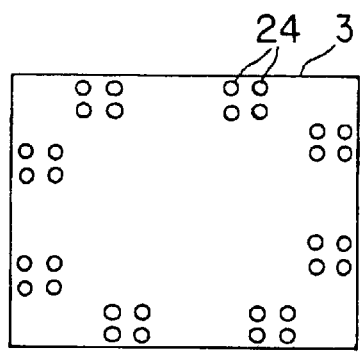 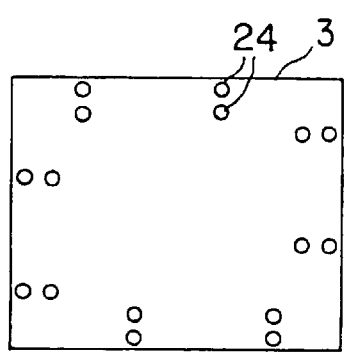 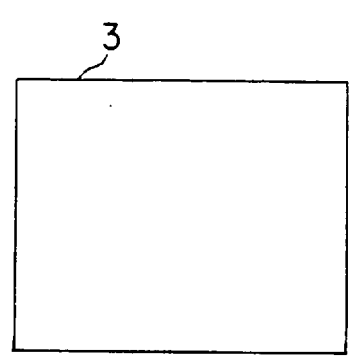
FIG.14
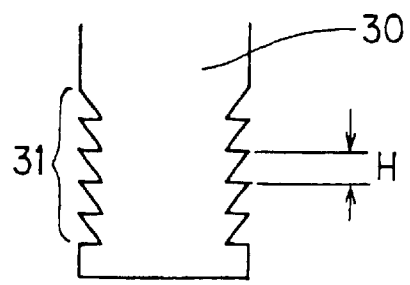

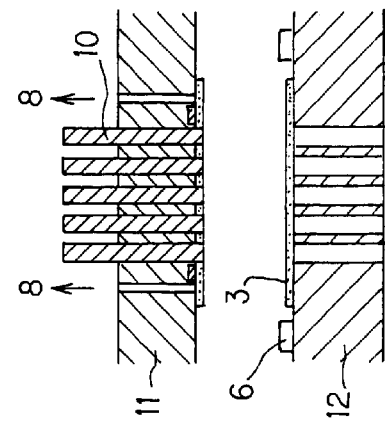
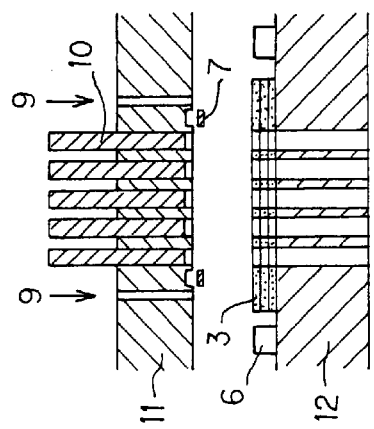
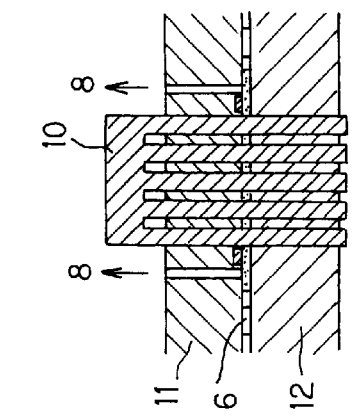
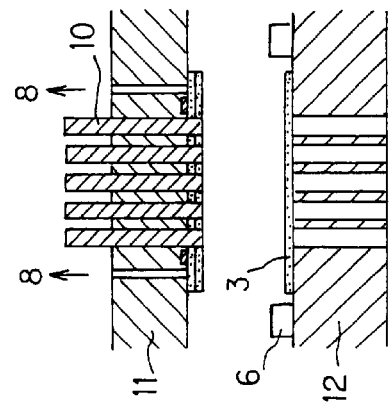
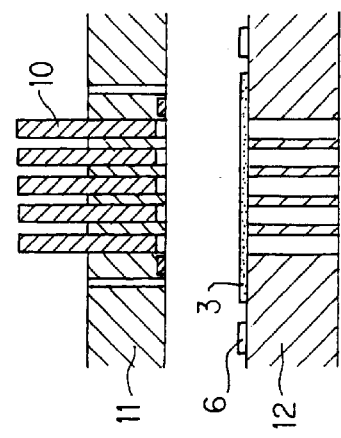
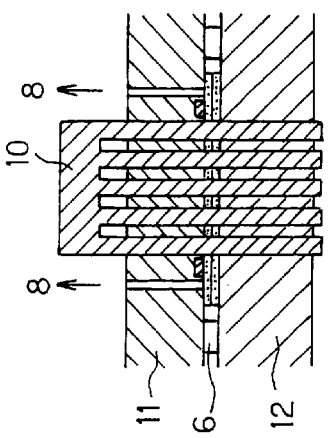

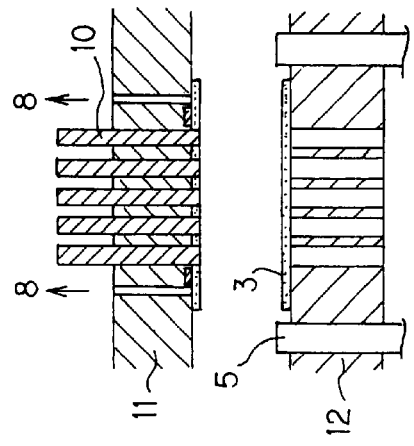
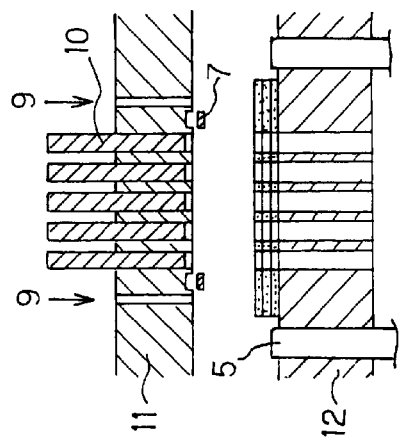
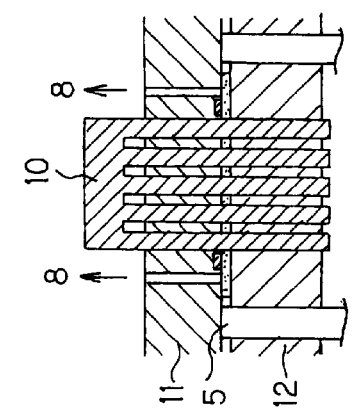
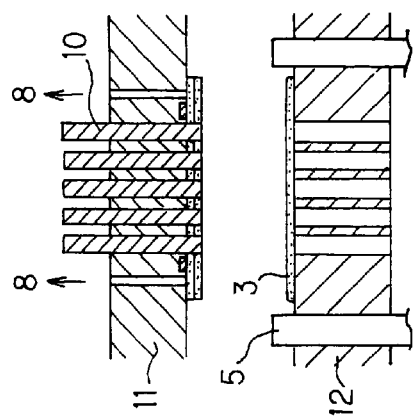
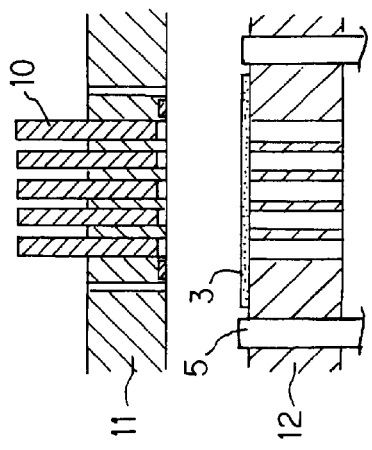
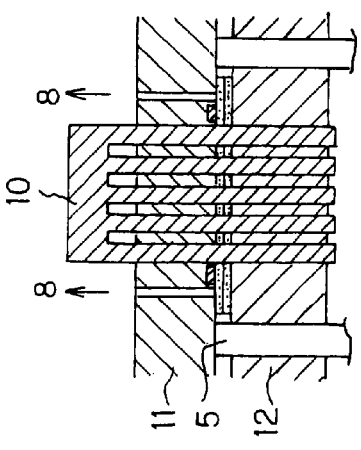

PROCESS FOR PRODUCING AN INDUSTRIAL MEMBER HAVING THROUGHHOLES OF HIGH ASPECT RATIO

CROSS-REFERENCE OF RELATED APPLICATION

The present invention is a Continuation-in-Part Application of the pending U.S. patent application Ser. No. 09/771,223 filed on Jan. 26, 2001.

BACKGROUND OF THE INVENTION AND RELATED ART

The present invention relates to a method for fabrication of industrial parts having high-aspect-ratio through-hole sections at high density, and, more specifically, when using a soft material which is deformed by handling after blanking, to a method for fabrication of industrial parts by which many high-aspect-ratio through-hole sections are formed into industrial parts with a predetermined thickness, with a similar high accuracy to that of hole sections drilled in a thin sheet material.

Reduction in cost, weight, and size has been commonly required in all industrial products, especially in industrial products equipped with many electrical circuits. The requirement of a small size for circuits has resulted in remarkable developments in packaging technologies for these circuits. Among these developments, small through-hole sections have been required to be fabricated with good accuracy for wiring boards having electronic components mounted thereon so as to more densely integrate electronic circuits, while considering cooling effects, and to secure high reliability. Moreover, technologies to accurately drill small through-hole sections in industrial parts have been indispensable, for example, through-hole sections smaller than those of wiring boards, have been required to be drilled with very high accuracy for ink ejecting sections of inkjet printers.

Recently, there have been much more densely integrated electronic circuits, and it has been necessary to drill a larger number of small through-hole sections in a predetermined area of material substrates. Then, it has been necessary for the through-hole sections to be smaller and deeper in the hole dimension, in other words, for the diameter to be smaller and the axial length (depth) of the above through-hole sections to be longer. That is, it has been necessary for those aspect ratios to be higher. Therefore, it has been required to form the through-hole sections with high accuracy. Generally, the aspect ratio denotes the ratio of the diameter to the axial length of the through-hole section when the through-hole section is cylindrical, and that of the shortest distance between mutually opposing edges in a surface where the through-hole section is opened when not cylindrical. Here, the shortest distance between the mutually opposing edges of the hole is depicted by S. in FIGS. 5(a) and 5(b). That is, a high-aspect-ratio through-hole section means a long and narrow hole with a long axial length compared with the diameter or the shortest distance of the hole.

Hole-drilling with a blanking die may be listed as one conventional method for drilling a large number of small through-hole sections in such a sheet material. The above drilling is a method for making industrial parts by performing a one time, blanking of a sheet material with a predetermined thickness using a punch and a die. In the above method, there has been a problem of poor accuracy as a thick sheet material is treated as a blanking object from the beginning, requiring a large clearance between the punch and the die. Moreover, a shearing force larger than that of a thin sheet material is applied during blanking, and a large number of holes are required, especially for the die, when the through-hole sections are formed with a high density. Therefore, the strength of the die may not withstand the above large shearing force, deformation may be caused due to shortage of the rigidity, and, furthermore, the problem of damage may also occur.

FIGS. 3(a) and 3(b) show a drilling state of a through-hole section with a blanking die. As shown in FIG. 3(a), cracks 15 are caused generally from each edge 14 of a punch 10 and a die 12 during blanking, when the punch 10 performs blanking of a sheet material 13 put on the die 12 after provision of a clearance 16 as a space between the punch 10 and the die 12. The cracks 15 are generated in the vicinity of the clearance 16, and the accuracy of the through-hole section varies within the range of the clearance 16. Thereby, according to the method for drilling of through-hole sections with the blanking die, the cross section of the through-hole sections of a sheet material after blanking is generally tapered in the blanking direction, as shown in FIG. 3(b).

The clearance 16 for the blanking die is required to be larger for a thicker sheet material, for example, 4–12% of the sheet thickness for thin sheets, and 18–26% of the sheet thickness for thick sheets, according to "BASIC MACHINING (I)", published by THE NIKKAN KOGYO SHIMBUN LTD. That is, the accuracy of holes is reduced for a thick sheet material, as described above. Therefore, the above methods are not suitable for high-density drilling of high-aspect-ratio, small through-hole sections, as the sizes of the diameters at the exit side in the blanking direction are uneven.

As an improved method for hole drilling with the above blanking die, there has been a method for obtaining industrial parts with a predetermined thickness, by which, after the thin sheet materials undergo blanking, the thin sheet materials are transferred and laminated. In the above method, since the sheet thickness of the material for blanking at one time is thin, resulting in superior accuracy of the hole sections for each sheet of sheet material in each blanking and reduced shearing force caused by the punch and the die, holes may be drilled very densely. However, there are problems of low production efficiency and high cost, as jigs for transferring the sheet materials and space for lamination are required, and there are an increased number of machining steps. Moreover, since guide pins are needed for precise lamination, waste is also caused by drilling holes other than the necessary through-hole sections in the industrial parts. Furthermore, when using a soft material which can be deformed after blanking, and when the industrial parts are laminated to a predetermined thickness, gaps occur between holes after transfer and lamination and the problem of reduced accuracy of the through-hole sections occurs. Therefore, the above method is not suitable for very dense drilling of high-aspect-ratio, small through-hole sections.

As another conventional method, there is a method for hole drilling with a laser beam, not using the blanking die. It is machining with a laser beam, that is, a machining method in which a work material is exposed to the laser beam after the above beam is focussed with a lens. According to the above machining with the laser beam, there is a fundamental problem of poor accuracy in the case of the high-aspect-ratio through-hole sections, as the through-hole sections are tapered in the propagating direction of the laser beam due to the laser beam focussing method.

FIGS. 4(a) and 4(b) show a drilling state of a through-hole section formed by laser beam machining. As shown in FIG.

4(a), in a laser machining apparatus, a parallel beam light 17 passes through a condensing lens 18 and is focussed for machining at position of a focal distance 20. A greater distance from the focus causes the laser beam width 19 to become broader, that is, the diameter of the machined through-hole section becomes larger. Thereby, in the case of a larger thickness of the sheet material, while the hole at the exit side in the propagating direction of the laser beam is being drilled, a through-hole portion with a larger diameter is drilled at the entrance side in the propagating direction of a laser beam. As a result, a tapered through-hole section will be formed, as shown in FIG. 4(b).

Moreover, as thermal energy is used for the laser beam machining, a sheet material to be machined is deformed by the effect of heat, and an altered layer is formed. Thereby, another problem of uneven diameters of through-hole sections also occurs. Even in the above problem, a larger thickness of the sheet material causes a lower accuracy of the through-hole sections, as the sheet material with the larger thickness requires a larger amount of laser beam energy, that is, a larger amount of thermal energy. Therefore, it is also difficult to say that the above laser beam machining is suitable as a method for high-density drilling of high-aspect-ratio through-hole sections.

As described above, there have been many developments in higher density mounting technology for industrial fields, especially for electronic components, and, in industrial parts for which fine through-hole sections are required to be drilled at high density, methods for making high-aspect-ratio through-hole sections with no damage, more safely and with higher accuracy have been required, even when using a soft material having a dimension or a shape in which deformation may be caused by handling after hole drilling. However, suitable methods have not been proposed.

SUMMARY OF THE INVENTION

The present invention has been made, considering the above problems, and the object is to solve the problems in conventional technologies, and, to contribute to increased density packaging of industrial parts, especially, of electronic equipment. This is accomplished by provision of industrial parts having a predetermined thickness and a plurality of high-aspect-ratio, small through-hole sections, based on a configuration where, even when using soft material which can be deformed, there may be drilled fine through-hole sections with a narrow diameter, for example, 100 μm or less, and with an axial length whose ratio with respect to the diameter is larger than a predetermined ratio. The above drilling is performed with similar accuracy to that of through-hole sections drilled in one sheet of thin sheet material, and approximately in a cylindrical shape which are formed in a straight line.

The inventors of the present invention have examined various kinds of methods and fabrication steps for hole-drilling of a sheet material with a blanking die, and found that the following fabrication method achieves the above purpose: in a die blanking method using a punch and a die, the above material is lifted in tight contact with a stripper under a state where the punch is not pulled out from the hole section, after drilling of the hole section in the sheet of sheet material with the punch; the punch lifted from the die is returned so as to be slightly drawn in from a bottom section of the hole section; similarly, the subsequent material is lifted in tight contact with the lower section of the previous sheet material, while being laminated on each other, under a state where the punch is not pulled out from the hole section, after drilling of the hole section with the punch; the punch lifted from the die is returned so as to be slightly drawn in from the bottom section of the hole section; and the above steps are repeated to laminate a plurality of sheets of sheet material with drilled holes in a device with the punch and the die.

That is, the present invention provides a fabrication method of an industrial part having high-aspect-ratio through-hole sections, using a punch and a die, including: a first step of drilling a first hole section in a first sheet of sheet material with the punch; a second step of lifting the above first sheet in tight contact with a stripper under a condition that the punch is not pulled out from the first hole section; a third step of lifting the punch so that a tip section of the punch is slightly drawn in from a bottom section of the lifted first sheet of sheet material; a fourth step of drilling a second hole section in a second sheet of sheet material with the punch; a fifth step of lifting the above second sheet in tight contact with the above first sheet under a condition that the punch is not pulled out from the second hole section; and a sixth step of lifting the punch so that the tip section of the punch is slightly drawn in from the bottom section of the lifted second sheet of sheet material; and, wherein, subsequently, the above fourth to sixth steps are repeated for bonding and lamination of a plurality of sheets of sheet material.

In the first and fourth steps, it is preferable to interpose a spacer between the die and the stripper when the hole section is drilled with the punch. The spacer is preferably about 5–15 μm thicker than a total thickness of sheet material present in the die and the stripper, in other words, a total thickness of sheet material already laminated on the punch and sheet material disposed on the die to be drilled.

After the above fourth to sixth steps are repeated for lamination of a desired number of sheets of sheet material, that is, when the drilled sheets of sheet material are separated from the blanking die, a work-receiving jig is inserted into a space over the die under the condition that laminated sheets of sheet material are lifted to be transferred from the blanking die to the work-receiving jig.

It is preferable that a method for fabrication of industrial parts having high-aspect-ratio through-hole sections of the present invention includes: a step of removing refuse at the first hole section of the first sheet material under the condition that the tip section of the punch is slightly protruded from the bottom section of the lifted first sheet of sheet material between the second and the third steps, and a step of removing refuse at the second hole section of the second sheet material under the condition that the tip section of the punch is slightly protruded from the bottom section of the lifted second sheet of sheet material. The refuse may be removed by an air-blow means where refuse is removed by a flow of compressed air or an adhesion means where refuse is removed by sticking the refuse on an adhesive medium.

In the present invention, an accuracy of a size of the above through-hole sections which are drilled in the above industrial part may be arranged to be similar to that of the hole sections drilled in the above one sheet of sheet material.

Moreover, in the present invention, it may be possible to form high-aspect-ratio through-hole sections, that is, the ratio of the diameters, or the shortest distances from one edge to the opposing edge of the above through-hole sections to the axial lengths, approximately 1:1–1:15, and also to form through-hole sections with the ratio of the distance between the through-hole sections adjacent to each other to the axial length of the above corresponding sections approximately, 1:1–1:15. Moreover, it may be possible to form high-aspect-ratio through-hole sections, where the diameter of the above sections is 100 μm or less; and also to form high-aspect-ratio through-hole sections, where the distance between through-hole sections adjacent to each other is 100 μm or less.

In the present invention, sheets of sheet material to be laminated may be bonded to each other by using the above sheet material with a bonding agent previously applied thereto, or by inserting a bonding sheet between the sheets of sheet material. Furthermore, each sheet material may be laminated in tight contact with each other, using vacuum suction, after previous drilling of holes in the above sheet material for vacuum suction.

BRIEF DESCRIPTION OF THE DRAWINGS

FIGS. 1(a)–1(e) show an explanatory view of steps for one embodiment of a method for fabrication of industrial parts having high-aspect-ratio through-hole sections, using a punch and a die, according to the present invention; FIG. 1(a) shows a preparation step for a first sheet of thin sheet material where the first sheet is put on a die; FIG. 1(b) shows a blanking step for the first sheet where the first sheet is blanked with a die; FIG. 1(c) shows a preparation step for a second sheet; FIG. 1(d) shows a blanking step for the second sheet; and FIG. 1(e) shows a sheet blanking completion step where the laminated sheets of sheet material are separated from a stripper after completion of blanking and lamination of all the sheets.

FIG. 2(a) shows a perspective view of one embodiment of the industrial part having high-aspect-ratio through-hole sections; and FIG. 2(b) shows an enlarged view of the high-aspect-ratio through-hole sections shown in FIG. 2(a).

FIGS. 3(a), and 3(b) show a view of drilling of a through-hole section with a blanking die according to a conventional method; FIG. 3(a) shows a schematic view of a state of generated cracks; and FIG. 3(b) shows an explanatory view of a cross section of the through-hole section of a sheet material after blanking.

FIGS. 4(a), and 4(b) show a view of drilling of a through-hole section with laser beam machining according to a conventional method; FIG. 4(a) shows a schematic view of a fabrication state with a laser beam; and FIG. 4(b) shows an explanatory view of a cross-section of the through-hole section after laser beam machining.

FIG. 5(a) is an explanatory view showing one example of the shortest distance of the throughhole section; and FIG. 5(b) is an explanatory view showing another example of the shortest distance of the through-hole section.

FIG. 6 is an explanatory view showing one example of a cross-section of a high-aspect-ratio through-hole section according to the present invention.

FIG. 7 is an explanatory view of a step showing an example of a conventional blanking method using a punch and a die.

FIG. 8 is an explanatory view of a step showing another example of a conventional blanking method using a punch and a die.

FIGS. 9(a)–9(c) are explanatory views of steps showing an example of a method of fabrication of industrial parts having high-aspect-ratio through-hole sections, using a punch and a die, of the present invention; FIG. 9(a) shows a preparation step where a sheet of thin sheet material is mounted on a die, FIG. 9(b) shows a blanking step where the the sheet of sheet material is blanked by a punch, and FIG. 9(c) shows a refuse-removing step where a stripper is lifted with the sheet of the sheet material to remove refuse.

FIG. 10 is an explanatory view showing an example of a conventional blanking method using a punch and a die.

FIG. 11 is an explanatory view showing an example of a method of fabrication of industrial parts having high-aspect-ratio through-hole sections, using a punch and a die, of the present invention.

FIGS. 12(a)–12(c) shows an explanatory view of steps inn showing an example of a method of fabrication of industrial as parts having high-aspect-ratio through-hole sections, using a punch and a die, of the present invention; FIG. 12(a) shows a sheet-blanking-completion step A where all the desired number n (n=3) of sheets of sheet material are punched and laminated, and the stripper is lifted, FIG. 12(b) shows a sheet-blanking-completion step B where a work-receiving jig is inserted in a space over a die, and 12(c) shows a sheet-blanking-completion step C where the laminated sheets of sheet material are separated from the stripper to be transferred from the stripper to the work-receiving jig.

FIGS. 13(a)–13(f) is an explanatory view showing an example of a method of fabrication of industrial parts having high-aspect-ratio through-hole sections, using a punch and a die, of the present invention; FIG. 13(a) shows a hole for vacuum suction disposed in the stripper, FIG. 13(b) shows a hole for vacuum suction disposed in the first sheet of sheet material, FIG. 13(c) shows a hole for vacuum suction disposed in the second sheet of sheet material, FIG. 13(d) shows a hole for vacuum suction disposed in the third sheet of sheet material, FIG. 13(e) shows a hole for vacuum suction disposed in the fourth sheet of sheet material, and FIG. 13(f) shows a hole (no hole) for vacuum suction disposed in the fifth (last) sheet of sheet material.

FIG. 14 is a side view showing an embodiment of a punch used for a method of fabrication of industrial parts having high-aspect-ratio through-hole sections of the present invention.

FIG. 15(a) is a step of preparing the first sheet, wherein the first thin sheet of sheet material is mounted on a die, FIG. 15(b) shows a condition that the stripper is pulled down to make the stripper abut against the sheet material on the die in a blanking step for the first sheet, FIG. 15(c) shows a condition that a blanking the first sheet with a punch into the die in a blanking step for the first sheet, FIG. 15(d) shows a condition that the punch is slightly drawn in from the bottom section of the lifted sheet material with the stripper being kept abutting against the sheet material on the die, FIG. 15(e) shows a condition that the stripper is lifted in the blanking step for the first sheet, and FIG. 15(f) shows a step of preparing the second sheet.

FIGS. 16(a)–16(f) are explanatory views of steps showing an example of a method of fabrication of industrial parts having high-aspect-ratio through-hole sections, using a punch and a die, of the present invention; FIG. 16(a) is a step of preparing the first sheet, wherein the first thin sheet of sheet material is mounted on a die, FIG. 16(b) shows a blanking step for the first sheet, wherein the first sheet is blanked with a punch, FIG. 16(c) shows a step of preparing the second sheet, FIG. 16(d) shows a step of blanking the second sheet, FIG. 16(e) shows a step of preparing the third sheet, FIG. 16(f) shows a sheet-blanking-completion step C where the laminated sheets of sheet material are separated from the stripper after the completion of blanking and laminating of all the sheet.

FIGS. 17(a)–17(f) are explanatory views of steps showing an example of a method of fabrication of industrial parts having high-aspect-ratio through-hole sections, using a punch and a die, of the present invention; FIG. 17(a) shows a step of preparing the first sheet, wherein the first thin sheet of sheet material is mounted of a die, FIG. 17(b) shows a blanking step for the first sheet, wherein the first sheet is blanked with a punch, FIG. 17(c) shows a step of preparing the second sheet, FIG. 17(d) shows a step of blanking the second sheet, FIG. 17(e) shows a step of preparing the third sheet, FIG. 17(f) shows a sheet-blanking-completion step C where the laminated sheets of sheet material are separated from the stripper after the completion of blanking and laminating of all the sheet.

FIG. 18(a) shows a step of preparing the first sheet, wherein the first thin sheet of sheet material is mounted of a die, FIG. 18(b) shows a blanking step for the first sheet, wherein the first sheet is blanked with a punch, FIG. 18(c) shows a step of preparing the second sheet, FIG. 18(d) shows a step of blanking the second sheet, FIG. 18(e) shows a step of preparing the third sheet, FIG. 18(f) shows a sheet-blanking-completion step C where the laminated sheets of sheet material are separated from the stripper after the completion of blanking and laminating of all the sheet.

DETAILED DESCRIPTION OF THE INVENTION

Figure 2A:
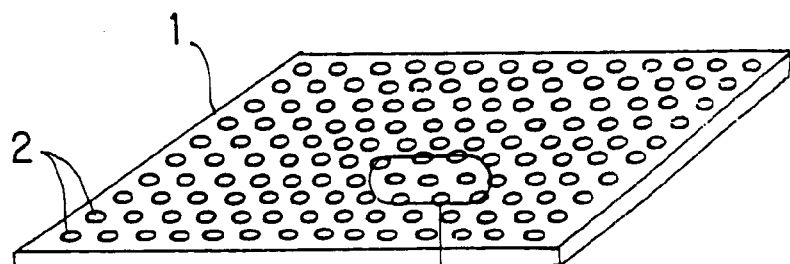
FIGS. 2(a), and 2(b) show a view of an industrial part having high-aspect-ratio through-hole sections according to the present invention.

Hereinafter, embodiments of a method for fabrication of industrial parts having high-aspect-ratio through-hole sections according to the present invention will be described in detail. However, the present invention is not limited to the above embodiments, and various kinds of modifications, corrections, and improvements may be added based on the knowledge of those skilled in the art without departing from the spirit and scope of the present invention.

In the present specification, a through-hole section and a hole section denote the same hole drilled through a sheet of sheet material having a thickness from one surface thereof to the other surface. However, a hole section means a hole drilled through a laminated one sheet of sheet material.

The present invention is characterized in that thin sheet materials are laminated in a fabrication device having a punch and a die, using the punch itself as a lamination axis like a guide pin in conventional methods. And, it is also characterized in that, when the tip section of the punch is slightly drawn in from the bottom section of the lifted sheet material, lifting of the punch is stopped so as to prevent deformation of a hole section drilled for each sheet of thin sheet material.

FIG. 10 shows an example of a conventional blanking method using a punch and a die. A certain clearance is necessary between the punch 10 and a hole of the stripper 11 as long as the punch moves in the hole of the stripper 11. Therefore, a shift is caused between the central axis of the punch 10 and the central axis of the hole of the stripper 11 at any cost.

Conventionally, as shown in FIG. 10, a direction and a size of the shifts a1, a2, a3 between the central axis of the punch 10 and the central axis of the stripper 11 vary every time a sheet is blanked, and each sheet of sheet material has a hole in different position. Therefore, even if a through-hole section is formed by laminating these sheets, a hole section having high accuracy cannot be obtained.

According to characteristics of the present invention, a direction and a size of shift between the central axis of a punch and the central axis of a hole of the stripper is not changed every time a sheet is blanked. That is, since force acts in the direction of crimping the punch from the outer circumference (direction of a radius) in a blanked hole in the lifted sheet of sheet material, the punch can be held. Therefore, more accurate hole section can be drilled in a sheet of sheet material.

FIG. 11 shows an explanatory view showing an example of a method for fabrication of industrial parts having high-aspect-ratio through-hole sections according to the present invention, showing a condition that a stripper 11 is lifted after three sheets of sheet material 3 are blanked. As this example, even in the case of drilling a through-hole section in the three sheets of sheet material 3, each of the shifts a4, a5, a6 is not changed in each hole section in the three sheets of sheet material 3 because the sheet material 3 is laminated with a punch 10 used as an axis through the central axis of the punch 10 and the central axis of the hole of the stripper 11 have the shifts a4, a5, a6 having a different direction and a different size. Therefore, a through-hole section formed through the laminated three sheets of sheet material 3 has higher accuracy. Further, since the sheet material 3 supports the punch 10 around a tip section of the punch 10, the sheet material 3 also has a function of avoiding buckling of the tip section of the punch 10.

In the present invention, it may be possible by the above configuration to form high-aspect-ratio through-hole sections at high density with similar accuracy to that of hole sections drilled in a thin sheet material, even when using a soft material which can be deformed by handling after punching, though a larger thickness causes a lower accuracy of the through-holes in conventional methods in the case of industrial parts with a predetermined thickness.

Figure 2B:
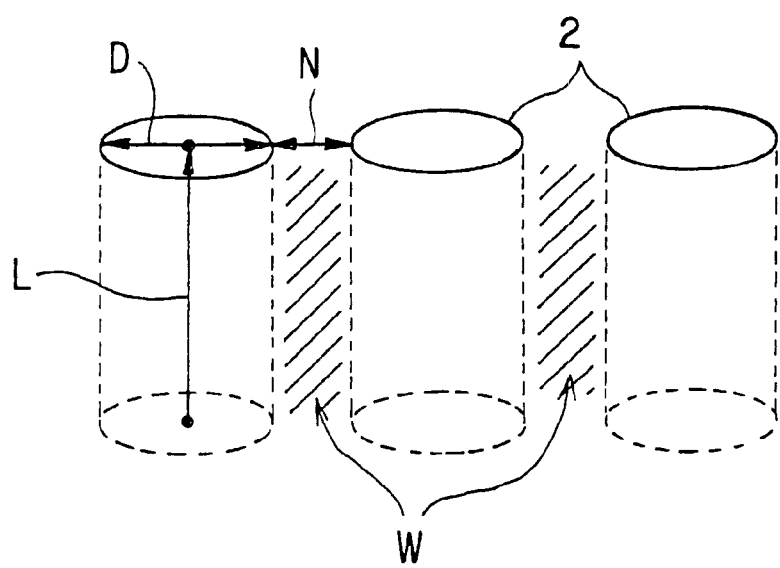
Figure 5A:
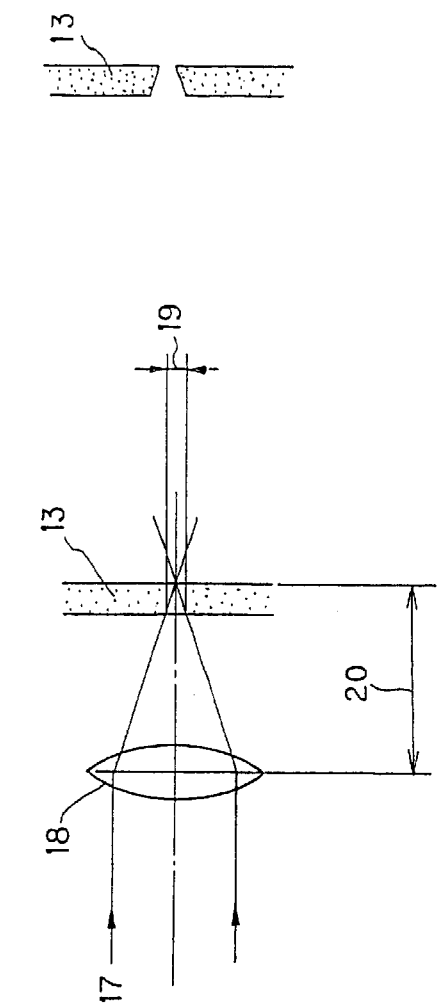
FIGS. 5(a) and 5(b) show a view of industrial parts having high-aspect-ratio through-hole sections according to the present invention.
Figure 5B:

The high density drilled high-aspect-ratio through-hole sections, which are required for wiring boards for electric circuits and ink jet sections for printers and so on are shown in FIGS. 2(a) and 2(b) and described as follows:

FIG. 2 shows a view of an industrial part 1 having high-aspect-ratio through-hole sections according to the present invention. FIG. 2(a) shows a view of one embodiment of an industrial part 1 having high-aspect-ratio through-hole sections 2; and FIG. 2(b) shows a enlarged view of a part of the above through-hole sections. In the industrial part 1, it is preferable to form narrow through-hole sections with a ratio of the diameter D to the axial length L of approximately 1:1–1:15. And, in the industrial part 1, it is required to form through-hole sections at high density with a ratio of the distance N between through-hole sections adjacent to each other to the axial length L of the through-hole sections of approximately 1:1–1:15. Both the above diameter D and the above distance N of the through-hole sections are of several tens of μm. In the industrial part 1, many of such small holes with a dimension of 100 μm or less are required to be drilled at a spacing of 100 μm or less with high accuracy, and the above requirements may be realized by the fabrication method of industrial parts having high-aspect-ratio through-hole sections according to the present invention.

Through-hole sections with high accuracy are assumed to be the ones with an approximately constant diameter D of the through-hole sections for all portions of the axial length L of the through-hole sections. In other words, they are holes piercing through the thickness of a sheet material, that is, the through-hole section 2 is configured to be almost cylindrical when the cross-section of the through-hole section 2 is assumed to be a circle. The cross-section of the through-hole sections is not necessarily required to be a circle, for example, it may be a long and narrow ellipse as shown in FIG. 6. That is, any type of cross-sections may be used for the through-hole sections. When the accuracy of through-hole sections is low, and through-hole sections 2 are formed at high density formed, two or more through-hole sections are joined by elimination of the distance N between through-hole sections adjacent to each other and/or the strength becomes insufficient by reducing in the above distance. Thereby, deformation, such as bending and/or damage of the wall section W between the through-hole sections 2 adjacent to each other will be caused, and the reliability of the industrial part 1 may be significantly reduced. However, such a problem will not occur according to the fabrication method of industrial parts having high-aspect-ratio through-hole sections according to the present invention, as it is possible to fabricate industrial parts with high accuracy in the shape even when the thickness of the above wall section W is thin.

A soft material having a dimension or a shape, which is fabricated by the method of industrial parts having high-aspect-ratio through-hole sections according to the present invention, and in which deformation is caused by handling after hole drilling, is soft material with, for example, a Young's modulus of less than 3000 kgf/mm$^2$, for example, polyethylene (Young's modulus of 310 kgf/mm$^2$), polyimide (Young's modulus of 430 kgf/mm$^2$), reinforced plastic (Young's modulus of 2500 kgf/mm$^2$), and greensheet (Young's modulus of 4 kgf/mm$^2$). Moreover, even when the Young's modulus is 3000 kgf/mm$^2$ or more, a piece of material, for example, very thin sheet metal having a size or a shape in which deformation is caused by handling after hole drilling, may be used as an object for the present invention.

Then, one embodiment of a fabrication method of industrial parts having high-aspect-ratio through-hole sections according to the present invention will be described.

First, schematic steps of a fabrication method with FIGS. 1(a)–1(e).

A blanking machine mainly includes a punch 10, a die 12 and a stripper 11 and each sheet of thin sheet material 3 is put on the die 12 one-by-one for blanking with the punch 10. The quality, size, and thickness of the thin sheet material 3 are not specially limited, and, for example, a green sheet with a thickness of 40 μm may be used.

FIG. 1(a) shows a state where a first sheet of thin sheet material 3 is put on a die for preparation of blanking. Then, the first sheet of sheet material 3 is blanked with the punch 10, as shown in FIG. 1(b). Thereafter, preparation for blanking of a second sheet is started as shown in FIG. 1(c), but the first sheet of sheet material 3 is not moved to another place for lamination, in a different manner from that of conventional methods, that is, the above first sheet 3 is moved upward in tight contact with the stripper 11, while being inserted in the punch 10. Vacuum suction 8 using an intake port passing through the stripper 11 as shown in FIG. 1(c) may be used for tight contact of the sheet material 3 with the stripper 11' and bonding of it onto the stripper 11 may be also used, for example, by application of a bonding agent on the surface of the first sheet of sheet material 3.

Here, it is preferable that the punch 10 is not returned into the hole section of the first sheet of sheet material 3 which is lifted together, when the punch 10 and the stripper 11 are lifted from the die 12 as shown in FIG. 1(c), for starting of preparation for blanking of the above second sheet. It is important to stop lifting when the above punch is slightly drawn in from the bottom section of the thin sheet material 3. Here, ". . . is slightly drawn in . . . " means that the punch is always under a condition that at least a portion of the punch is not protruding from the bottom section of thin sheet material 3. The hole section is deformed in the sheet material 3 when using soft material, and the accuracy of the hole may be reduced when the sheet material 3 is laminated for the industrial part 1, if the punch 10 is returned into the hole section of the sheet material 3, or it is completely stored in the stripper 11.

Though a method for lamination of thin sheet material is applied, as the punch 10 itself is used as a lamination axis of the thin sheet material, like the guide pin in the conventional methods, and deformation of the drilled hole section is prevented with the punch 10 itself as described above, there is no need for jigs for transferring the sheet material 3 and a lamination space, and, moreover, the number of fabrication steps is reduced. Therefore, the industrial part 1 having high-aspect-ratio through-hole sections and with a similar fabrication accuracy to that of holes drilled in a thin sheet material may be fabricated at reduced cost.

FIG. 1(d) shows a blanking step for the second sheet. Thereafter, preparation for blanking as shown in FIG. 1(c) is performed, and the above operation is repeated for sequential lamination of a plurality of sheets of sheet material 3 in the blanking machine.

As shown in FIG. 1(e), laminated sheets of sheet material 3 are separated from the stripper 11 for completion of blanking, after completion of blanking and lamination of all the sheets of sheet material 3.

Next, details from the step for preparation of blanking of the aforementioned first sheet of sheet material 3 (FIG. 1(a)) to the step for preparation of blanking of the second sheet of sheet material 3, that is, details of blanking of the first sheet is described with reference to FIGS. 15(a)–15(f).

Figure 15D:
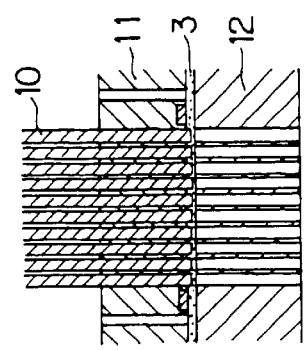
FIGS. 15(a)–15(f) are explanatory views of detail steps showing an example of a method of fabrication of industrial parts having high-aspect-ratio through-hole sections, using a punch and a die, of the present invention.
Figure 15C:
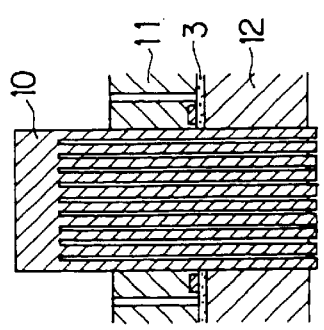
Figure 15B:
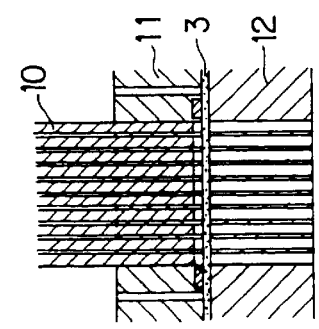
Figure 15F:
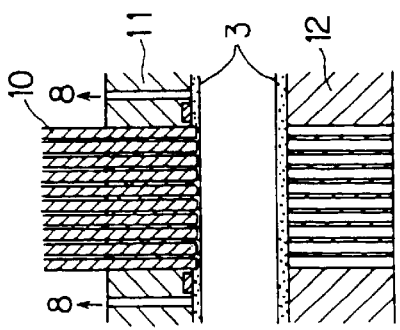
Figure 15A:
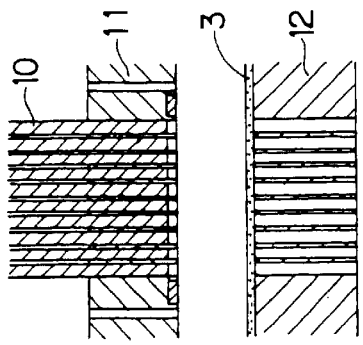

FIG. 15(a) shows a condition that the first thin sheet of sheet material 3 is put on the die 12 as in FIG. 1(a). Then, as shown in FIG. 15(b), the stripper 11 is brought down to contact the sheet material 3 on the die 12. At this time, the punch 10 is still in the stripper. It is not preferable that the sheet material 3 is blanked with the punch 10 before the stripper 11 abuts against the sheet material 3 on the die 12 when the stripper 11 is brought down. The stripper 11 functions to grip the punch and to press the sheet material 3 when the stripper 11 brought down. If the sheet material 3 is not pressed, blanking becomes unstable when the sheet material 3 has a poor flatness and undulation, and the sheet material 3 cannot be blanked accurately. Further, deformation except for a shear of the sheet material 3 caused upon blanking, specifically, warpage or the like can be avoided by pressing with the stripper 11. If deformation is not prevented, the sheet material 3 cannot be blanked accurately.

Subsequently, as shown in FIG. 15(c), the sheet material 3 is blanked with the punch 10 under the condition that the stripper 11 abuts against the sheet material 3 on the die 12, and the punch 10 is inserted into the die 12. As shown in FIG. 15(d), first, only the punch 10 is lifted to be slightly drawn in from the bottom section of the sheet material 3 with the stripper 11 being kept abutting against the sheet material 3 on the die 12. It is not preferable that the stripper 11 is lifted with the punch 10 being drawn in or prior to the punch 10 being drawn in. This is because accuracy can be kept by lifting the punch 10 with maintaining this arrangement since the condition of being surrounded by the stripper 11, the die 12, and the punch 10 is the condition that the blanking configuration of the sheet material 3 is ensured accurately.

Figure 15E:
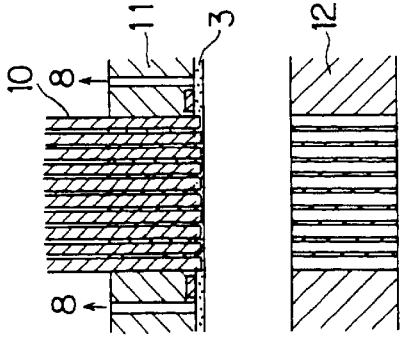
Figure 18A:
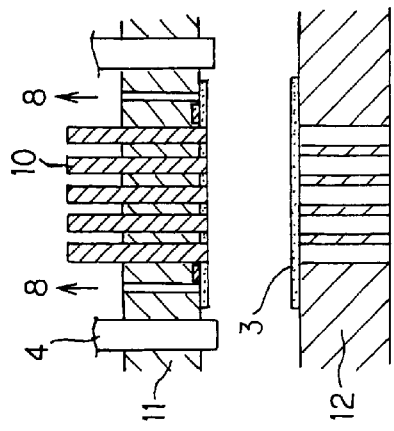
FIGS. 18(a)–18(f) are explanatory views of steps showing an example of a method of fabrication of industrial parts having high-aspect-ratio through-hole sections, using a punch and a die, of the present invention.
Figure 18B:
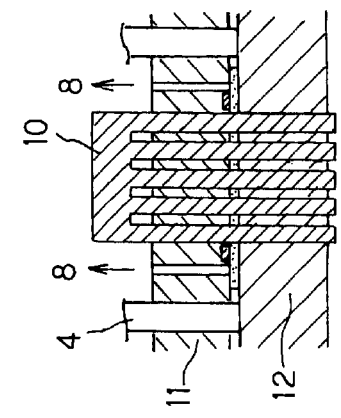
Figure 18C:
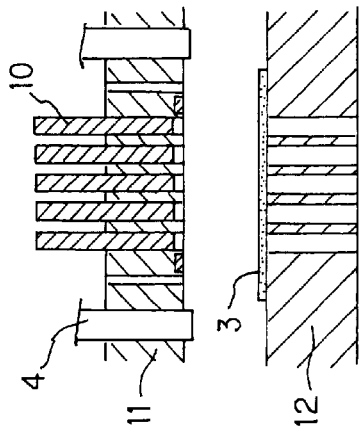
Figure 18D:
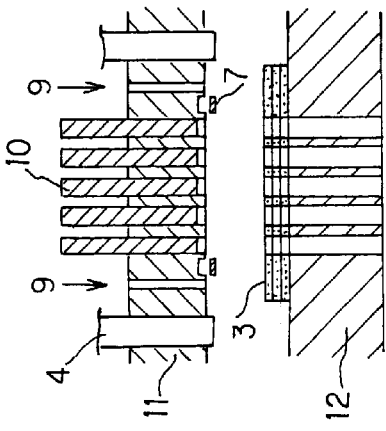
Figure 18E:
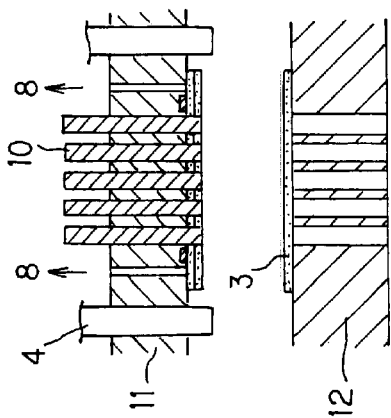
Figure 18F:
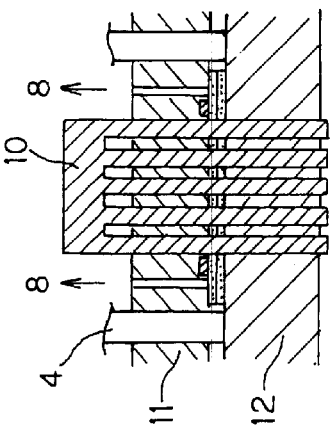

As shown in FIG. 15(e), the stripper 11 is lifted with the punch penetrating the sheet material 3 to complete blanking of the first sheet. FIG. 15(f) shows a step of preparing the second sheet as in FIG. 1(c).

Next, a method of accurate blanking even in easily deformed material is described with FIGS. 16(a)–16(f), 17(a)–17(f), 18(a)–18(f), and FIG. 20. FIGS. 16(a)–16(f), 17(a)–17(f), and 18(a)–18(f) are explanatory views of steps showing an example of a method of fabrication of industrial parts having high-aspect-ratio through-hole sections, using a punch and a die, of the present invention, and showing a method of blanking by means of a spacer between a die and a stripper.

As described above, a hole section is drilled more accurately by repeating a blanking step with laminating the sheet mateial where the hole section is drilled on the punch. However, when easily deformed material is used, accuracy in a hole section is sometimes lowered.

Upon blanking, the stripper abuts against the sheet material on the die before the punch drills the hole section, the sheet material is sandwiched between the stripper and the die, and a compressive force is applied to the sheet material where the hole section is already drilled and which is laminated on the stripper and the sheet material which is put on a die and going to be drilled. At this time, the sheet material laminated on the stripper is pressed and deformed in the case that a material which is easily deformed by a compressive force is employed. However, the punch, which is an axis of lamination, is fixed, the sheet material is relatively deformed, and accuracy of shape of the already drilled hole section is sometimes lowered. On the other hand, in the sheet material put on the die, the hole section is drilled by the punch under the condition that the stripper abuts against the sheet material and that the sheet material is pressed. Therefore, accuracy in position and size of the hole section is sometimes lowered in accordance with restoration to the original shape from elastic deformation caused after blanking.

It is preferable to perform blanking by means of a spacer between a die and a stripper as shown in FIG. 16(a)–16(f), 17(a)–17(f), and 18(a)–18(f) in order to drill a more accurate hole section in soft sheet material. The stripper directly abuts against sheet material by employing a spacer between a die and a stripper, which prevents a compressive force from being applied to the sheet material.

FIGS. 16(a)–16(f) are view showing production steps where, for example, an extrapolating shim 6 is used as a spacer.

Figure 20:
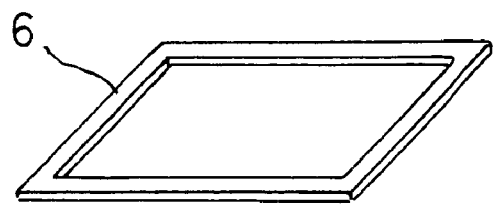
FIG. 20 is a perspective view showing an extrapolating shim used in a method of fabrication of industrial parts, which steps are shown in FIGS. 16(a)–16(f).

FIG. 16(a) shows a condition that the first thin sheet material 3 isput on the die 12 to prepare for blanking. In addition, an extrapolating shim 6 having a shape, for example, as shown in FIG. 20 is also mounted on the die 12. It is preferable that the extrapolating shim 6 is about 5–15 $\mu$m thicker than the sheet material 3 on the die. Next, the first sheet material 3 is blanked with a punch 10 as shown in FIG. 16(b). At this time, the stripper 11 abuts the extrapolating shim 6 which is slightly thicker than the sheet of sheet material 3 without directly abutting the sheet material 3. Therefore, even if the sheet material 3 is very soft, it is not deformed upon blanking, and a hole section formed in the sheet material 3 by blanking is accurate. Then, in preparation for blanking of the second sheet shown in FIG. 16(c), the blanked first sheet material 3 is in tight contact with the stripper 11 and lifted with the punch 10 penetrating the first sheet of sheet material 3. The extrapolating shim 6 is mounted on the die. It is preferable that the extrapolating shim 6 is about 5–15 $\mu$m thicker than the total thickness of the sheet material 3 lifted with the punch penetrating the sheet material 3 and the sheet of sheet material 3 which is put on the die 12 and is going to be blanked.

FIG. 16(d) shows a blanking step of the second sheet of sheet material 3. In the same manner as in FIG. 16(b) for the first sheet, the stripper 11 abuts against the extrapolating shim 6 without directly abutting the sheet material 3 to prevent the sheet material 3 from deformation. In the same way, the hole section formed in the sheet material 3 becomes accurate. Then, in FIG. 16(e), blanking of the third sheet is prepared. An extrapolating shim 6 which is preferably about 5–15 $\mu$m thicker than the total thickness of the already blanked sheet material 3 which is lifted with the punch 10 penetrating the sheet material 3 and the sheet material 3 which is put on the die 12 and going to be blanked. The extrapolating shim 6 prevents the stripper 11 from directly abutting against the sheet material 3. This is repeated to laminate a plurality of sheets of sheet material 3 in the blanking machine in order. As shown in FIG. 16(f), when all sheets of sheet material 3 are blanked to complete lamination, the laminated sheet material 3 is separated from the stripper 11 to complete blanking.

The extrapolating shim 6 mounted on the die 12 upon blanking the sheet material 10 with the punch 10 is always made about 5–15 $\mu$m thicker than the total thickness of the already blanked sheet material 3 which is lifted with the punch 10 penetrating the sheet material 3 and the sheet material 3 which is put on the die 12 and going to be blanked, as described above, so as to prevent the stripper 11 from pressing the sheet material 3 even by variance in thickness of the sheet material 3 and even by deformation of the stripper 11 and die 12 caused upon blanking. When the extrapolating shim 6 is thinner than the total thickness of the lifted sheet material 3 with the punch 10 penetrating the sheet material 3 and the sheet material 3 put on the die 12 or when the difference is less it than about 5 $\mu$m even if the extrapolating shim 6 is thicker than the total thickness, the stripper 11 sometimes presses the sheet material 3, which is not preferable. When the difference is larger than about 15 $\mu$m to the contrary, bending of the sheet material 3 is not sufficiently suppressed, which is not preferable.

As long as the aforementioned conditions are followed, whenever the number of lamination of the sheet material 3 increases and a thicker extrapolating shim 6 is required, the used extrapolating shim 6 may be replaced with another extrapolating shim 6 having different thickness. Alternatively, extrapolating shims may be piled up.

A spacer, for example, the aforementioned extrapolating shim 6 is present between a die and a stripper upon blanking and can prevents the stripper from directly abutting against the sheet material to apply a compressive force to the sheet material. The shape of the spacer is not limited as long as the spacer is about 5–15 μm thicker than a total thickness of the lifted sheet material with the punch penetrating the sheet material and the sheet material put on the die to blank the sheet material.

For example, in the case of the aforementioned extrapolating shim 6, a spacer may be a plurality of square bars or flat boards, or thin cylinders or prisms put at the four corners of the sheet of sheet material 3. However, a frame-shaped spacer as shown in FIG. 20 is preferable because it can easily be machined to have the same thickness (height) and easily suppress inclination of the die 12 and the stripper 11.

Production steps using an ascent and descent shim as another example of a spacer are shown in FIGS. 17(*a*)–17(*f*).

An ascent and descent shim 5 shown in FIGS. 17(*a*)–17(*f*) moves up and down in the die 12, adjusts the height of protruding from the upper surface of the die 12, and forms a space between the die 12 and the stripper 11 upon blanking with the punch 10 so as to prevent the stripper 11 from directly abutting against the sheet material 3 and applying a compressive force to the sheet material 3.

FIG. 17(*a*) shows a condition that the first sheet of sheet material 3 is put on the die 12 to prepare for blanking. At this time, the ascent and descent shim 5 is moved up so as to protrude about 5–15 μm higher than the thickness of the sheet of sheet material 3 on the die 12 from the upper surface of the die 12. Then, as shown in FIG. 17(*b*), the first sheet of sheet material 3 is blanked with the punch 10. At this time, the stripper 11 abuts against the ascent and descent shim 5 slightly protruded from the thickness of the sheet of sheet material 3 without abutting the sheet material 3 directly. Therefore, even if the sheet material 3 is a very soft material, the material is not deformed upon blanking, and a hole section formed in the sheet material 3 by blanking becomes accurate. Then, in preparing for blanking of the second sheet shown in FIG. 17(*C*), the blanked first sheet of sheet material 3 is in tight contact with the stripper 11 with the punch 10 penetrating the first sheet of sheet material 3 and moved up. A height of the ascent and descent shim 5 protruded from the upper surface of the die 12 is adjusted to be about 5–15 μm higher than a total thickness of the blanked sheet material 3 lifted with the punch 10 penetrating the sheet material 3 and the sheet material 3 which is put on the die 12 and which is going to be blanked.

FIG. 17(*d*) shows the blanking step of the second sheet of sheet material 3. As in FIG. 17(*b*) for the first sheet, the stripper 11 abuts against the ascent and descent shim 5 without directly abutting the sheet material 3 to prevent the sheet material 3 from deforming. In the same way, the hole section formed in the sheet material 3 becomes accurate. Then, in FIG. 17(*e*), blanking of the third sheet is prepared. In the same manner, a height of the ascent and descent shim 5 protruding from the upper surface of the die 12 is adjusted to be about 5–15 μm higher than a total thickness of the blanked sheet material 3 lifted with the punch 10 penetrating the sheet material 3 and the sheet material 3 which is put on the die 12 and going to be blanked, thereby preventing the stripper 11 from directly abutting against the sheet material 3 upon blanking. This is repeated to laminate a plurality of sheets of sheet material 3 in a blanking machine in order. As shown in FIG. 17(*f*), when all the sheets of sheet material 3 are blanked to complete lamination, the laminated sheet material 3 is separated from the stripper 11 to complete blanking.

As described above, a shape of the spacer is not limited. Therefore, when the ascent and descent shim 5 is employed as a spacer, the shape may be, for example, a long and narrow shape sandwiching the sheet material 3, or a circle or rectangular put outside the four corners of the sheet material 3, or a frame-like shape surrounding the sheet material 3, as a horizontal sectional shape of the ascent and descent shim 5 though it is not illustrated.

An ascent and descent shim used as a spacer is not limited to the ascent and descent shim 5 moving up and down in the die 12 as shown in FIGS. 17(*a*)–17(*b*) and may be the ascent and descent shim 4 moving up and down in the stripper 11 as shown in FIGS. 18(*a*)–18(*f*). Production steps using the ascent and descent shim 4 are shown in FIGS. 18(*a*)–18(*f*).

The ascent and descent shim 4 shown in FIGS. 18(*a*)–18(*f*) moves up and down in the stripper 11, adjusts the length protruding from the lower surface of the stripper 11, forms a space between the die 12 and the stripper 11 upon blanking with the punch 10, and prevents the stripper from directly abutting against the sheet material 3 and applying a compressive force to the sheet material 3.

Incidentally, details of a role and production process of the ascent and descent shim 4 as a spacer is according to the production process using the ascent and descent shim 5 shown in FIGS. 17(*a*)–17(*f*). Therefore, description on the production process is omitted.

Generally, in a blanking machine, the lower block where a die is present has a smaller number of parts than the upper block, and can easily secure a space for an ascent and descent mechanism to move a shim up and down. In this respect, the ascent and descent shim 5 is more preferably employed than the ascent and descent shim 4. In the extrapolating shim 6 shown in FIGS. 16(*a*)–16(*f*) is compared with the ascent and descent shims 4, 5, the extrapolating shim 6 is advantageous in initial cost and remodeling cost required when a thickness of sheet material is changed. However, the ascent and descent shims 4, 5, which are automatizable, has higher processing speed, and therefore, superior in contributing to improvement of throughput and, in its turn, contributing to decrease in cost for industrial parts to be produced.

Figure 19:
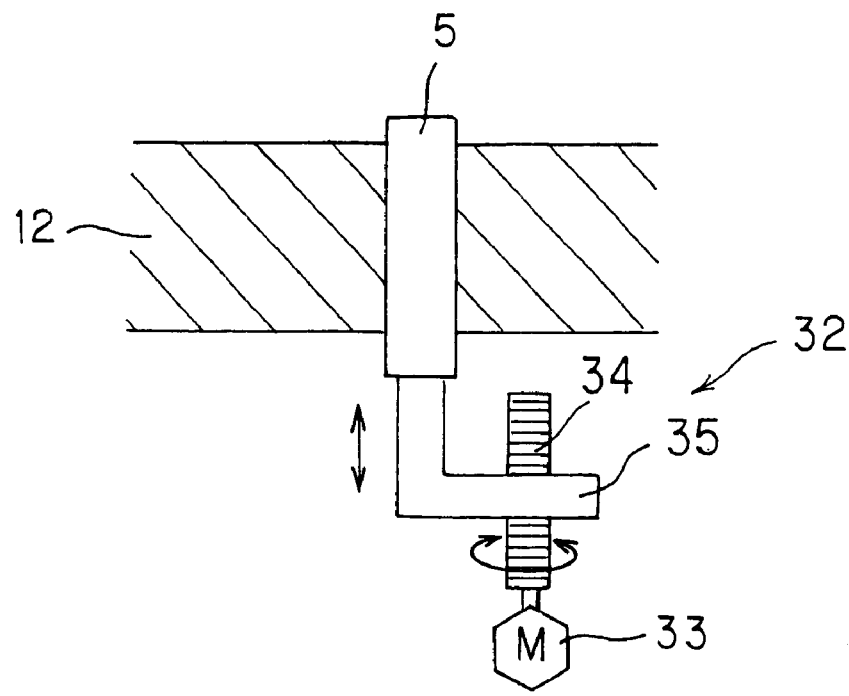
FIG. 19 is a cross-sectional view showing an example of ascent and descent mechanism of a shim used as a spacer of the present invention.

An example of ascent and descent mechanism for moving a shim up and down is shown in FIG. 19. FIG. 19 is an explanatory view showing an ascent and descent mechanism 32 where an ascent and descent shim 5 which moves up and down in a die 12 is attached. The ascent and descent mechanism 32 can convert a rotary motion generated by an accurate servomotor 33 to a linear motion due to, for example, a mechanism consisting of a positive screw 34 rotated by the servomotor 33 and a negative screw 35 which engages with the positive screw 34 and accurately move the ascent and descent shim 5 up and down.

Then, a process of removing refuse to prevent clogging of refuse in a hole section drilled in sheet material is described with FIGS. 9(*a*)–9(*c*).

FIG. 9(*a*) shows a condition of preparation before blanking, where sheet material 3 is put on a die 12. Then, as shown in FIG. 9(*b*), the sheet material 3 is blanked with the punch 10. At this time, refuse formed by blanking and originating from a hole section of the sheet material is generated. Almost all the refuse falls of in a counterbore section 21 in the die. However, a part of the refuse adheres to the punch 10 and is lifted upward. If the refuse lifted upward adheres to the sheet material 3, a poor blanked product is given. Therefore, as shown in FIG. 9(*c*), the stripper 11 is lifted together with the sheet material 3,and the refuse is removed in the condition that a tip section of the punch 10 is slightly protruded by a7 from the lower surface of the lifted sheet material 3. Here, ". . . is slightly protruded" means at least a portion of punch 10 is not drawn in from the lower surface of lifted sheet material 3.

There is no case that refuse remains in the hole section of the sheet material 3 because the punch 10 is not separated from the hole section of the sheet material 3 formed by blanking. It is enough to remove refuse stuck on the die 12 or on the lower surface of the punch 10 or the sheet substrate 3. Removal of refuse is easy, and moreover, there is no case that refuse remains in a hole section of the sheet material 3, thereby furthermore improving yield.

Since it is not performed that sheet material is lift in tight contact with a stripper after the sheet material is blanked in a conventional method of fabrication, sheet material was subjected to vacuum suction, blowing under pneumatic pressure to the contrary, sticking on an adhesive medium, or the like, from the lower side of the sheet material on a die, i.e., from the side of a counterbore section to remove refuse so as not to remain in a hole section of the sheet material.

In the case of a blanking machine having a large punch pitch, which has a punch 10 having a large diameter of a tip section and which can give a wide span between adjacent punches as the one whose blanking step is shown in FIG. 7; a counterbore section 21 of a die has a sufficient space. Therefore, refuse can be removed in the aforementioned manner. However, in the case of a blanking machine having a small punch pitch, which has a punch 10 having a small diameter of a tip section and a narrow span between adjacent punches, removal of refuse in the aforementioned manner has been difficult.

A blanking machine as the one whose blanking step is shown in FIG. 8 has often been used in recent years with an advance in high densification of through-hole sections. In such a blanking machine, a diameter of a punch 10 is small particularly in a tip section a8, and a length of the tip section a8 is made as short as possible to prevent the tip section a8 from bending. Since the punch 10 is required to protrude in a counterbore section 21 of the die, a thickness b of the upper surface of the counterbore section 21 of the die becomes thin, and strength of the die 12 is lowered. Further, since shear force of the punch 10 becomes large because of small punch pitch, a load on the die 12 becomes larger. Therefore, reinforcement of the die 12 such as providing the counterbore section 21 of the die with a rib, or the like, for the purpose of improving strength of the die 12. However, such reinforcement makes a structure of the die 12 complex and a work of removing refuse difficult. As a result, refuse cannot be removed sufficiently and remains in a hole section of sheet material 3, thereby lowering yield.

Since refuse can be removed from the die 12 in the present invention, refuse can be easily removed regardless of a structure of the die 12. In addition, since the sheet material 3 is not separated from the punch until blanking and lamination are completed, it seldom happens that refuse enters in a hole section of the sheet material 3.

Incidentally, a means for removing refuse in the present invention may be the same as the conventional one, and it may be suitable selected from means such as blowing refuse by compressed air, which makes equipment simple, sticking on an adhesive medium, and the like.

Next, a method for separating the laminated sheet material from a stripper is described.

As previously shown in FIG. 1(e), as a method for removal of the laminated sheet materials 3 from the stripper 11, there may be, for example, a method in which stopping of the vacuum suction for lifting the sheet material 3, vacuum braking, and mechanical separation with a stripping jig 7 are sequentially performed. At this time, the method is not that the sheet material 3 removed from the punch 10 and the stripper 11 is taken out after the sheet material 3 is put on the die 12. It is preferable, for example, to transfer the laminated sheet material 3 to a work-receiving jig and send to the next step to improve production efficiency. It is suitable in the case of soft sheet material because deformation is hardly caused.

FIGS. 12(a)–12(c) are explanatory views of a step where the laminated sheet material is transferred to the jig and show an example of separating three sheets of sheet material from a punch and a stripper after the sheet material is blanked and laminated. When the stripper 11 is lifted with keeping the blanked and laminated sheet material 3 in tight contact therewith as shown in FIG. 12(a), a work-receiving jig 23 is inserted in the space over the die 12 as shown in FIG. 12(b), and the punch 10 is lifted with respect to the stripper 11 as shown in FIG. 12(c), thereby separating the sheet material 3 from the punch 10, stopping vacuum suction 8 by which the sheet material 3 is lifted, conducting vacuum breaking 9, mechanically taking out the laminated sheet material 3 from the stripper 11 by stripping jig 7, and mounting on a work-receiving jig 23.

There is a need for bonding of the sheet materials 3 on each other for obtaining the industrial part 1 by lamination of the sheet materials 3, and, as a bonding method, previous application of a bonding agent onto the surface of each sheet material 3 for bonding may be performed, and, also, a bonding sheet may be inserted between two sheets of the sheet materials 3 for bonding adjacent to each other. However, a sheet material, which is previously provided with a bonding agent on the surface is preferably used, as there are an increased number of steps for blanking when bonding sheets are used.

Alternatively, a hole capable of suction is drilled in the sheet material in advance to laminate the sheet material by vacuum suction. FIGS. 13(a)–13(f) show an example of arranging holes for vacuum suction opened in sheet material in the case that sheet material is laminated by vacuum suction.

FIG. 13(a) shows an example of holes 24 for vacuum suction disposed in the stripper 11, and FIG. 13(b) shows an example of holes 24 for vacuum suction disposed in the first sheet of sheet material 3. First, the first sheet of sheet material 3 is subjected to vacuum suction through the holes 24 which is present in FIG. 13(a) and not present in FIG. 13(b) when they are piled so as to be in tight contact with the stripper 11. Then, holes 24 for vacuum suction as in, for example, FIG. 13(c) are disposed in the second sheet of sheet material 3. The second sheet of sheet material 3 is subjected to vacuum suction through the holes 24 which is present in FIG. 13(b) and not present in FIG. 13(c) so as to be in tight contact with the first sheet of sheet material 3. In the same manner, FIG. 13(d) shows the holes 24 for vacuum suction disposed in the third sheet of sheet material 3, and FIG. 13(e) shows the holes 24 for vacuum suction disposed in the fourth sheet of sheet material 3. As shown in FIG. 13(f), the last (fifth) sheet of sheet material 3 followed by no sheet material to be laminated is not required to have holes 24 for vacuum suction.

A position for disposing holes for vacuum suction is not limited. However, it is preferable that the holes for vacuum suction are disposed equally around the four sides except for the last sheet of sheet material which does not need holes for vacuum suction because the sheet material is lifted by sucking force.

Further, all vacuum suction is generally performed by one vacuum apparatus. In this case, vacuum pressure does not generate as it is because the open holes for vacuum suction are present except the time to subject the last sheet of sheet material to vacuum suction. As a measure for this, vacuum pressure may be secured by fixing the place to be subjected to vacuum suction by each sheet, distinguishing a pipe line, and providing a path with a control valve; or the like. Alternatively, a sucking force to a degree of lifting sheet material can be exhibited by forming a throttle portion in a hole for vacuum suction.

As still another method for laminating the sheet material, it is preferable to employ a method where surface finishing of a punch is made rough to increase a friction force between the punch and the sheet material, and by this friction force, the sheet material is held on the punch. The sheet material is held by the punch, with the result that the sheet material blanked in order tightly contacts with a stripper to be laminated. Generally, blanked holes are subjected to elastic deformation in a direction that a punch is constricted, i.e., that a diameter of each hole becomes small because of inner stress generated in a blanking step. Particularly, material having larger elasticity has larger deformation. Therefore, rough surface finishing of the punch is sufficient for holding sheet material on the punch.

In the case that material having high elasticity is employed as sheet material, it is also preferable to use a punch 30 having a difference-in-level portion 31 like a bamboo shoot as shown in FIG. 14 on a surface thereof so as to hold sheet material on a punch more securely. The moment sheet material is blanked with the punch 30, the sheet material gets over the difference-in-level portion 31 without being plastically deformed and is laminated in order. If the difference in level H of the punch 30 is made equal to a thickness of the sheet material, the sheet material can be laminated with being in tight contact. In addition, the sheet material is caught by the difference-in-level portion 31 because of elastic deformation. Therefore, the sheet material does not fall off from the punch 30.

A method for fabrication of industrial parts having high-aspect-ratio through-hole sections is described above in detail. According to the present invention, highly accurate blanking machining shown below is realized.

For example, when a hole section is drilled in a sheet of green sheet with a thickness of 50 µm, as a sheet material, so as to have a through-hole section with a diameter D of 98 µm as the through-hole section, and a distance N between the above through-hole sections adjacent to each other of 50 µm as an industrial part, the clearance between the punch and the die at the sheet material may be of the order of approximately 2 µm, which is 4% of the sheet thickness. Here, the ratio of the diameter to the axial length of the hole section in one sheet of sheet material, that is, the aspect ratio, is approximately 2:1, and the ratio of the distance between the hole sections adjacent to each other to the axial length of the hole section is 1:1. When 12 sheets of the sheet material 3 are laminated to obtain an industrial part, the thickness is 0.6 mm, the ratio of the diameter D to the axial length L of the through-hole section of the industrial part 1, that is, the aspect ratio is roughly 1:6, and the ratio of the distance N between the through-hole sections adjacent to each other to the axial length of the through-hole section becomes 1:12. The through-hole section with such a high aspect ratio may be provided at a clearance for one sheet of sheet material, in other words, with a variance in accuracy of within 4 µm for the diameter D of the through-hole section.

Then, an example of the present invention will be described for confirmation of the advantages.

(Example) A wiring board was fabricated with a blanking machine including a punch and a die, using a sheet of greensheet with a Young's modulus of 4 kgf/mm$^2$ as the material, so that through-hole sections with a diameter of 80 µm and an axial length of 0.8 mm were formed at a spacing of 70 µm between adjacent through-hole sections.

In the above case, the thickness of one greensheet was configured to be 40 µm, and 20 sheets thereof were laminated with the punch as a lamination axis. After measurement of the diameter of a through-hole section of the obtained wiring board, it was found that it was 80 µm at the surface side and 80–83 µm at the back side of the above board. Moreover, observation of the surface and back sides of the above board with an optical microscope confirmed that there were no cracks and so on whatsoever.

(Comparative Example 1)

A wiring board was fabricated in a similar manner to that of the example except that the thickness of the greensheet was 0.8 mm, and only one greensheet without lamination was used. After measurement of the diameter of a through-hole section of the obtained wiring board, it was found that it was 80 µm at the surface side and 115–130 µm at the back side of the above board. Moreover, observation of the surface and back sides of the above board with an optical microscope confirmed that there were deformation of the holes and, cracks at edges of the hole in some throughhole sections.

(Comparative Example 2)

A wiring board provided with the similar through-hole sections to those of the above example was fabricated, using a laser machining apparatus, and a greensheet with a Young modulus of 4 kgf/mm$^2$ as the material. In a similar manner to that of the Comparative Example 1, only one sheet was used, and the thickness of the sheet used was 0.8 mm. After measurement of the diameter of a through-hole section of the obtained wiring board, it was found that it was 80 µm at the surface side and 40–69 µm at the back side of the above board. Moreover, observation of the surface and back sides of the above board with an optical microscope confirmed that there were deformation of the holes, reduced circularity, and burrs and chips at edges of the holes.

Thus, according to the present invention, there may be fabricated industrial parts in which small high-aspect-ratio through-hole sections are formed at high density without deformation and cracks with higher accuracy than that of conventional methods.

As described above, according to the present invention, there may be fabricated industrial parts, where fine through-hole sections, in which the diameter thereof is very small (100 µm or less), and axial length thereof is longer by a predetermined ratio or more compared with that of their diameters, that is, small high-aspect-ratio through-hole sections are provided at high density with similar accuracy to that of hole sections drilled in one sheet of thin sheet material, even when using soft material which can be deformed. Accordingly, the fabrication method of industrial parts having the above high-aspect-ratio through-hole sections may make it possible to fabricate, for example, desired wiring board and nozzles for discharging liquid. Moreover, it has great advantages in contributing to improved packaging technology for industrial parts, and in delivery of more compact and more convenient products for society.

We claim:

1. A fabrication method of an industrial part having high-aspect-ratio through-hole sections using a punch and a die, comprising:

a first step of drilling a first hole section in a first sheet of sheet material with said punch;

a second step of lifting said first sheet in tight contact with a stripper under a condition that said punch is not pulled out from the first hole section;

a third step of lifting said punch so that a tip section of said punch is slightly drawn in from a bottom section of said lifted first sheet of sheet material;

a fourth step of drilling a second hole section in a second sheet of sheet material with said punch;

a fifth step of lifting said second sheet in tight contact with said first sheet under a condition that said punch is not pulled out from the second hole section; and a sixth step of lifting said punch so that a tip section of said punch is slightly drawn in from the bottom section of said lifted second sheet of sheet material, wherein the fourth to sixth steps are repeated for lamination of a plurality of sheets of sheet material.

2. A fabrication method of an industrial part having high-aspect-ratio through-hole sections according to claim 1, wherein a spacer is interposed between said die and said stripper when the hole section is drilled with said punch in the first and fourth steps.

3. A fabrication method of an industrial part having high-aspect-ratio through-hole sections according to claim 2, wherein a spacer is about 5–15 μm thicker than a total thickness of sheet material present in the die and the stripper.

4. A fabrication method of an industrial part having high-aspect-ratio through-hole sections according to claim 1, wherein after the above fourth to sixth steps are repeated for lamination of a desired number of sheets of sheet material, a work-receiving jig is inserted into a space over the die, and laminated sheets of sheet material are transferred to the work-receiving jig.

5. A fabrication method of an industrial part having high-aspect-ratio through-hole sections according to claim 1, wherein the method includes:

a step of removing refuse at the first hole section of the first sheet material under a condition that a tip section of the punch is slightly protruded from the bottom section of the first sheet of the sheet material, said step of removing refuse at the first hole section being between the second and the third steps; and a step of removing refuse at the second hole section of the second sheet material under a condition that the tip section of the punch is slightly protruded from the bottom section of the second sheet of sheet material.

6. A fabrication method of an industrial part having high-aspect-ratio through-hole sections according to claim 5, wherein the refuse is removed by any one of an air-blow means where refuse is removed by a flow of compressed air or an adhesion means where refuse is removed by adhering the refuse on an adhesive medium.

7. A fabrication method of an industrial part having high-aspect-ratio through-hole sections according to claim 1, wherein the accuracy of a size of said through-hole sections drilled in said industrial part is arranged to be similar to that of said hole sections drilled in said first sheet of said sheet material.

8. A fabrication method of an industrial part having high-aspect-ratio through-hole sections according to claim 1, wherein the ratio of the diameters, or the shortest distances from one edge to the opposing edge of said through-hole sections to the axial lengths of said sections is approximately, 1:1–1:15.

9. A fabrication method of an industrial part having high-aspect-ratio through-hole sections according to claim 1, wherein the ratio of the distance between said through-hole sections adjacent to each other to the axial length of said corresponding sections is approximately 1:1–1:15.

10. A fabrication method of an industrial part having high-aspect-ratio through-hole sections according to claim 1, wherein the diameter of said through-hole sections is 100 μm or less.

11. A fabrication method of an industrial part having high-aspect-ratio through-hole sections according to claim 1, wherein the distance between said through-hole sections adjacent to each other is 100 μm or less.

12. A fabrication method of an industrial part having high-aspect-ratio through-hole sections according to claim 1, wherein said sheet material is used with a bonding agent previously applied thereto.

13. A fabrication method of an industrial part having high-aspect-ratio through-hole sections according to claim 1, further comprising a step of inserting a bonding sheet between said first sheet of sheet material and said second sheet of sheet material.

* * * * *

UNITED STATES PATENT AND TRADEMARK OFFICE
CERTIFICATE OF CORRECTION

PATENT NO. : 6,637,102 B2  Page 1 of 1
DATED : October 28, 2003
INVENTOR(S) : Yukihisa Takeuchi et al.

It is certified that error appears in the above-identified patent and that said Letters Patent is hereby corrected as shown below:

<u>Title page,</u>
Item [57], ABSTRACT,
Line 8, please change "said" to -- the --

<u>Column 1,</u>
Line 64, please delete ","

<u>Column 19,</u>
Line 17, please add -- subsequently -- after "are"

<u>Column 20,</u>
Line 7, please change "or" to -- and --

Signed and Sealed this

Sixteenth Day of December, 2003

JAMES E. ROGAN
*Director of the United States Patent and Trademark Office*